(12) United States Patent
Miller et al.

(10) Patent No.: US 7,414,322 B2
(45) Date of Patent: Aug. 19, 2008

(54) HIGH SPEED INTERFACE DESIGN

(75) Inventors: Leah M. Miller, Fremont, CA (US); Gregory S. Winn, Fort Collins, CO (US)

(73) Assignee: LSI Corporation, Milpitas, CA (US)

(*) Notice: Subject to any disclaimer, the term of this patent is extended or adjusted under 35 U.S.C. 154(b) by 382 days.

(21) Appl. No.: 11/193,808

(22) Filed: Jul. 29, 2005

(65) Prior Publication Data
US 2007/0023930 A1   Feb. 1, 2007

(51) Int. Cl.
*H01L 23/48*   (2006.01)
(52) U.S. Cl. .................................................... 257/786
(58) Field of Classification Search ................ 257/659, 257/786; 438/118, 628, 644, 654, 257
See application file for complete search history.

(56) References Cited

U.S. PATENT DOCUMENTS

| | | | | |
|---|---|---|---|---|
| 5,994,766 A | * | 11/1999 | Shenoy et al. | 257/659 |
| 6,538,336 B1 | * | 3/2003 | Secker et al. | 257/786 |
| 7,133,294 B2 | * | 11/2006 | Patel et al. | 361/782 |
| 2001/0013650 A1 | * | 8/2001 | Goetz et al. | 257/731 |
| 2004/0075991 A1 | * | 4/2004 | Haba et al. | 361/777 |

* cited by examiner

*Primary Examiner*—Wai-Sing Louie
*Assistant Examiner*—Bilkis Jahan
(74) *Attorney, Agent, or Firm*—Luedeka Neely & Graham, P.C

(57) ABSTRACT

The embodiments of the present invention are directed toward the design of routing patterns, including elements such as contacts, traces, and vias, for high speed differential signal pairs in integrated circuit package substrates.

18 Claims, 2 Drawing Sheets

US 7,414,322 B2

HIGH SPEED INTERFACE DESIGN

FIELD

This invention relates to the field of integrated circuit fabrication. More particularly, this invention relates to package substrate routing designs for high speed signals.

BACKGROUND

Integrated circuits are operating at ever increasing speeds. For example, integrated circuits for markets such as communication and storage are often embedded with multiple cores that send and receive signals at speeds greater than about two and one-half gigabits per second, which is defined herein to be a high speed signal or a high speed device.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar.

Integrated circuits are typically formed into packaged devices with a package substrate. The package substrate provides all of the electrical connections to the integrated circuit, and provides separate electrical connections to another structure, typically referred to as the printed circuit board. Thus, as the terms are used herein, there are three different structure types used in an electrical circuit, which structures are the integrated circuit, the printed circuit board, and the interface between the integrated circuit and the printed circuit board, which is the package substrate. As contemplated herein, the integrated circuit does not at any time physically contact the printed circuit board, and the printed circuit board and the package substrate are physically separate elements that are manufactured at different times and using different processes.

The distinction between the printed circuit board and the package substrate is further exemplified by the time at which they are electrically connected to the integrated circuit. The package substrate is considered to be a part of the packaged integrated circuit, and the integrated circuit is typically not shipped from the integrated circuit manufacturer until it is assembled as a packaged device with the package substrate. However, the packaged substrate is typically assembled with the printed circuit board in a different facility at a later time by a purchaser of the packed integrated circuit. Thus, one skilled in the art is able to quickly distinguish between a printed circuit board and a package substrate.

The typical construction and routing used by current technology package substrates tends to be unable to adequately handle the high speed signals used by some integrated circuit applications. What is needed, therefore, is a system of routing high speed signals in a manner that overcomes the problems and achieves the goals, such as those described above, at least in part.

SUMMARY

The above and other needs are met by a routing pattern for high speed signals for a package substrate. Traces for the high speed signals are disposed in trace pairs for differential pairs of high speed signals. The traces in a trace pair have substantially similar lengths, and are bounded along substantially their entire lengths by grounded guard traces. The traces have arcing corners, and straight portions of the traces have a length between the arcing corners and other reflecting portions of the traces that is not an integer multiple of a minimum time between transitions of the high speed signals.

Contacts for the high speed signals are connected to the high speed signal traces, where differential pairs of contacts are associated with the differential pairs of high speed signals. The contacts are exclusively disposed adjacent an edge of the package substrate, with a first of the contacts in the differential pair of contacts disposed closer to the edge of the package substrate than a second of the contacts in the differential pair. The contacts are disposed such that a line through the differential pair of contacts is substantially perpendicular to the edge of the package substrate.

The first contact in the differential pair of contacts is designated a positive contact and the second contact in the differential pair of contacts is designated a negative contact. All of the differential pairs of contacts are consistently disposed with the positive contact and the negative contact in a consistent position in each differential pair of contacts relative to the edge of the package substrate. The high speed contacts are disposed at a set orthogonal first distance one from another, and all contacts for the high speed signals are disposed from contacts for lower speed signals by a distance of more than $(2)^{1/2}$ times the set orthogonal first distance.

Vias for the high speed signals are connected to the high speed signal traces, where differential pairs of vias are associated with the differential pairs of high speed signals. The vias are disposed at a set orthogonal second distance one from another, and all vias for the high speed signals are disposed from vias for lower speed signals by a distance of more than $(2)^{1/2}$ times the set orthogonal second distance.

Plane metal is disposed symmetrically around the high speed vias and the high speed contacts. Redundant power vias are disposed adjacent a border of the package substrate where an integrated circuit edge is designed to reside. The redundant power vias connect in a straighter line between contacts on a first side of the package substrate, power planes, and contacts on an opposing second side of the package substrate than do other power vias. Power traces have a width that is greater than a width of the high speed signal traces.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
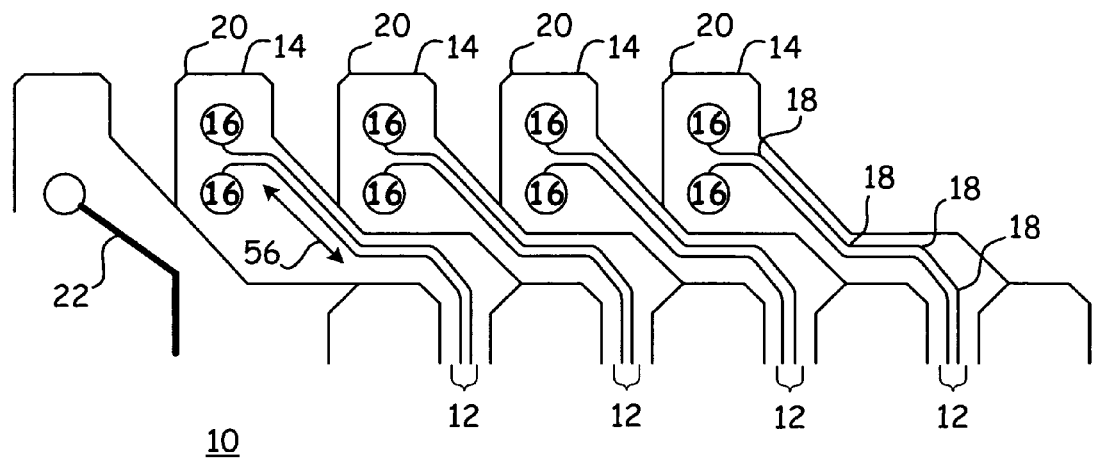
FIG. 1 depicts a high speed differential signal pair of traces on a routing layer of a package substrate according to a preferred embodiment of the present invention, where the differential pair of traces have substantially the same length, arcing corners, guard traces, and lengths between reflecting elements that are not an integer multiple of the bit distance of the high speed signals.

According to the preferred embodiments of the present invention, a targeted combination of design measures are applied to a package substrate, so that it can adequately handle high speed signals without unacceptable signal loss or other degradation. FIG. 1 depicts a high speed signal routing layer of a package substrate 10. High speed differential signals, such as receiver signals, transmitter signals, and clocks, are routed with high speed differential pair traces 12 that have matched lengths, so as to avoid adding duty cycle distortion. These high speed differential pair traces 12 are further routed with grounded guard traces 14 to their connections 16, which provides noise isolation for the high speed differential pair traces 12. In addition, spacing between the high speed differential pair traces 12 is set at a value that is appropriate to the package, and provides impedance control on the high speed differential traces 12.

The traces 12 for the high speed differential signals are routed with arcing corners 18 instead of angled corners 20, such as those on the guard traces 14, power traces, ground traces, and lower speed signal traces. The smoothly arcing, non-angled corners 18 help to reduce signal reflection along the traces 12, which tends to become more prevalent at high signal speeds. Other traces 22, such as those for analog signals, are preferably routed with wide metal traces, meaning that the traces 22 are wider than the traces 12 used for the high speed differential pair traces 12, to reduce the inductance and resistance on the traces 22.

In addition, all distances 56 between the reflections at the arcing corners 18 of the high speed signal traces 12 is preferably kept at a length that is something other than an integer multiple of a "bit time" of the high speed signal on the trace 12. A "bit time" is defined herein as the minimum time between signal transitions on the high speed trace 12, where the minimum time is defined by the protocol data rate, and a signal transition is defined as the signal transitioning from one logical state to another logical state, such as from a zero to a one, or from a one to a zero. Given the velocity of the waveform through the trace 12 material, one can calculate the time between reflections in an given specific case. The package substrate 10 design, specifically the straight lengths of the traces 12 between the arcing corners 18, can then be adjusted so that major transitions (impedance mismatches) are not an integer number of bit times apart, meaning that the signal transitions will not be unduly disturbed by the reflections along the high speed signal routing trace 12.

Figure 2:
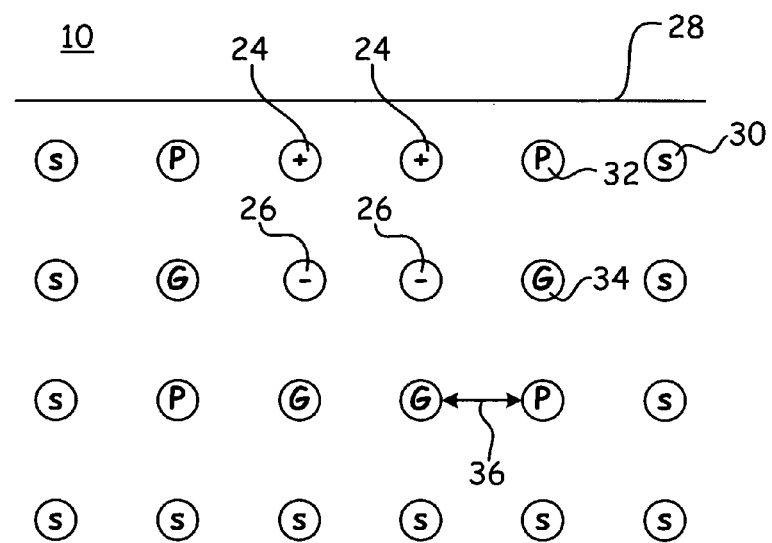
FIG. 2 depicts a contact layer of a package substrate according to a preferred embodiment of the present invention, where the differential pairs of high speed signal contacts are disposed adjacent and perpendicular to the edge of the package substrate, and other lower speed signal contacts are disposed no closer the high speed differential pair of contacts than $(2)^{1/2}$ times the spacing between the high speed differential pair of contacts.

High speed differential signals are routed to balls 24 and 26 at the edge 28 of the package substrate 10, as depicted in FIG. 2. Differential paired balls 24 and 26 at the terminus of the high speed differential signal traces 12 are disposed in an orientation that is perpendicular to the package substrate edge 28, and all such differential pairs of connections 24 and 26 are consistently assigned with the same polarity relative to the package substrate edge 28. As depicted in FIG. 2, all the connections 24 and 26 for the high speed signals are oriented with the positive signal connection 24 of the differential pair disposed adjacent the edge 28 of the package substrate 10, and the negative signal connections 26 of the differential pair disposed farther from the edge 28 of the package substrate 10.

It is appreciated that this is by way of example only, and that in other embodiments the negative signal connection 26 of the differential pair can be disposed adjacent the edge 28 of the package substrate 10, and the positive signal connection 24 of the differential pair can be disposed farther from the edge 28 of the package substrate 10.

High speed signal balls 24 and 26 are isolated from all lower speed signal balls 30 by more than a distance of the square root of two times the ball pad pitch 36, which eliminates all orthogonally adjacent and diagonally adjacent signal ball positions from the high speed signal balls 24 and 26 as candidate positions for lower speed signal balls 30. This tends to further reduce cross talk between the signals. The positions adjacent the high speed signal balls 24 and 26 can be occupied by combinations of power connections 32 and ground connections 34. The arrangements of the high speed signal connections 24 and 26, power connections 32, ground connections 34, and low speed signal connections 30 as depicted in FIG. 2 are by way of example and not limitation, except as described otherwise herein.

Figure 3:
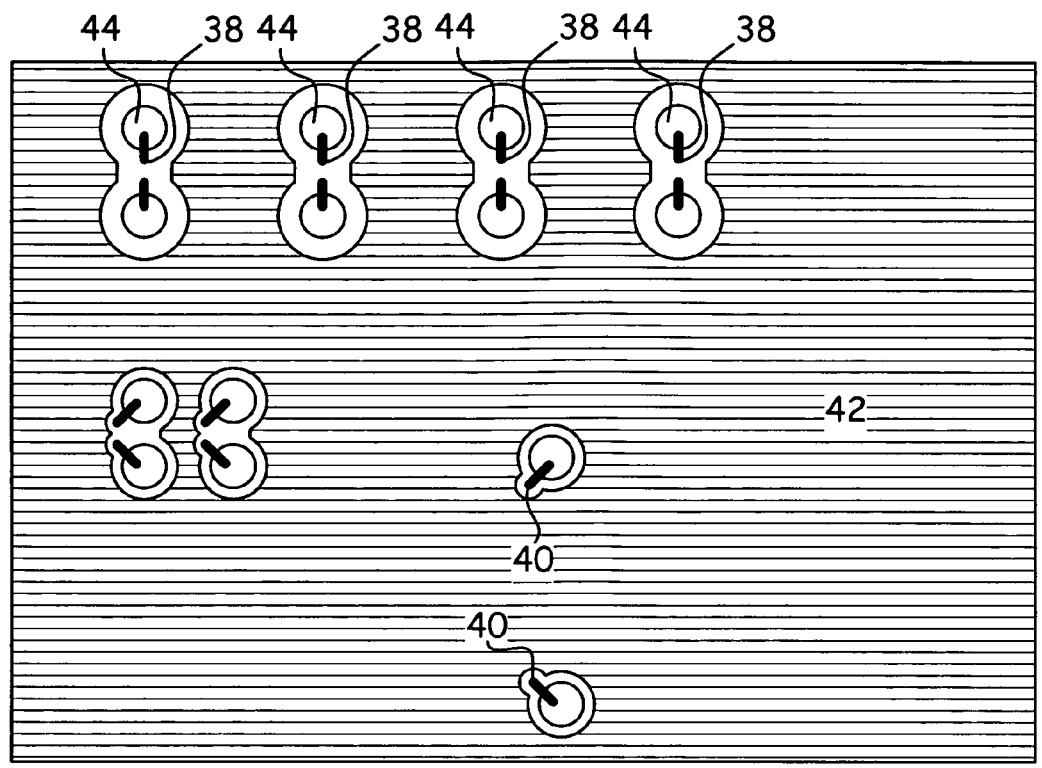
FIG. 3 depicts a ground layer in a package substrate according to a preferred embodiment of the present invention, where the ground layer is symmetrical around the vias, and the power vias have a spacing that is at least twice the spacing of the high speed signal vias.

Differential vias 38 for the high speed signals are spaced as appropriate for the package substrate 10 and the required frequency, while other non-differential vias 40, such as power vias, are spaced by at least twice the distance as the high speed differential vias 38, to reduce impedance mismatch, as depicted in FIG. 3. Spacing between planes 42 and high speed via capture pads or ball pads 44 is increased as appropriate for the required frequency, and plane metal 42 is disposed in a symmetrical pattern around the high speed pads 44 on the same layer, again to reduce impedance mismatch.

Figure 4:
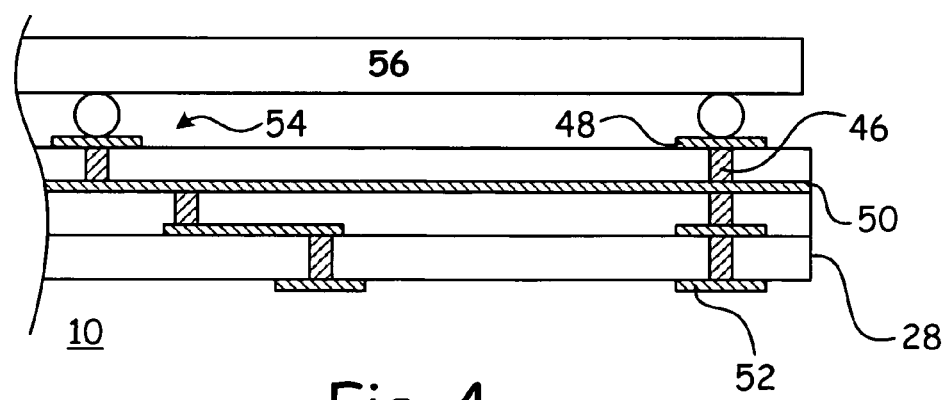
FIG. 4 depicts a cross sectional view of a package substrate and an integrated circuit according to a preferred embodiment of the present invention, where a redundant power via connects power contacts on either side of the package substrate to a power plane in a straighter line than other power vias.

Redundant power vias 46 are added near a location of the package substrate 10 where the edge of the integrated circuit 56 that is mounted on the package substrate 10 is disposed. This may or may not be near the edge 28 of the package substrate 10. The redundant power vias 46 run from connections 48 such as bump pads on one side of the package substrate 10 to power planes 50 and connections 52 such as ball pads on an opposing side of the package substrate 10 in a line that is as direct as possible, so as to reduce inductance and bump to ball resistance, as depicted in FIG. 4. These redundant power vias 46 are in addition to standard power vias 54, that are disposed at a more interior location of the package substrate 10, and do not necessarily take a straight line course between the connections on either side of the package substrate 10.

The present invention can be applied to any package technology, cross section, ball count, body size, or varying bump and ball pitches. It is applicable to any integrated circuit package technology, such as BGA, CSP, etc., in either ceramic or plastic types, and in either wire bond or flip chip versions.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A routing pattern for high speed signals for a package substrate, the routing pattern comprising:
   traces for the high speed signals, where trace pairs for differential pairs of high speed signals,
      have substantially similar lengths,
      are bounded along substantially their entire lengths by grounded guard traces,
      have arcing corners, and
      straight portions of the traces having a length between the arcing corners and other reflecting portions of the traces that is not an integer multiple of a minimum time between transitions of the high speed signals,
   contacts for the high speed signals, the contacts connected to the high speed signal traces, where differential pairs of contacts associated with the differential pairs of high speed signals,
      are exclusively disposed adjacent an edge of the package substrate, with a first of the contacts in the differential pair of contacts disposed closer to the edge of the package substrate than a second of the contacts in the differential pair,
      are disposed such that a line through the differential pair of contacts is substantially perpendicular to the edge of the package substrate,
      the first contact in the differential pair of contacts is designated a positive contact and the second contact in the differential pair of contacts is designated a negative contact, and all of the differential pairs of contacts are consistently disposed with the positive contact and the negative contact in a consistent position in each differential pair of contacts relative to the edge of the package substrate, and
      are disposed at a set first distance one from another, and all contacts for the high speed signals are disposed from contacts for lower speed signals by a distance of more than $(2)^{1/2}$ times the set first distance,
   vias for the high speed signals, the vias connected to the high speed signal traces, where differential pairs of vias associated with the differential pairs of high speed signals,
      are disposed at a set second distance one from another, and all vias for the high speed signals are disposed from vias for lower speed signals by a distance of more than $(2)^{1/2}$ times the set second distance,
   plane metal disposed symmetrically around the high speed vias and the high speed contacts,
   redundant power vias disposed adjacent a border of the package substrate where an integrated circuit edge is designed to reside, where the redundant power vias connect in a straighter line between contacts on a first side of the package substrate, power planes, and contacts on an opposing second side of the package substrate than do other power vias, and
   power traces having a width that is greater than a width of the high speed signal traces.

2. A routing pattern for high speed signals for a package substrate, the routing pattern comprising traces for the high speed signals, where trace pairs for differential pairs of high speed signals have arcing corners.

3. The routing pattern of claim 2, where the traces for the high speed signal,
   have substantially similar lengths,
   are bounded along substantially their entire lengths by grounded guard traces, and
   straight portions of the traces having a length between the arcing corners and other reflecting portions of the traces that is not an integer multiple of a minimum time between transitions of the high speed signals.

4. The routing pattern of claim 2, further comprising contacts for the high speed signals, the contacts connected to the high speed signal traces, where differential pairs of contacts associated with the differential pairs of high speed signals,
   are exclusively disposed adjacent an edge of the package substrate, with a first of the contacts in the differential pair of contacts disposed closer to the edge of the package substrate than a second of the contacts in the differential pair,
   are disposed such that a line through the differential pair of contacts is substantially perpendicular to the edge of the package substrate,
   the first contact in the differential pair of contacts is designated a positive contact and the second contact in the differential pair of contacts is designated a negative contact, and all of the differential pairs of contacts are consistently disposed with the positive contact and the negative contact in a consistent position in each differential pair of contacts relative to the edge of the package substrate, and
   are disposed at a set first distance one from another, and all contacts for the high speed signals are disposed from contacts for lower speed signals by a distance of more than $(2)^{1/2}$ times the set first distance.

5. The routing pattern of claim 2, further comprising vias for the high speed signals, the vias connected to the high speed signal traces, where differential pairs of vias associated with the differential pairs of high speed signals are disposed at a set second distance one from another, and all vias for the high speed signals are disposed from vias for lower speed signals by a distance of more than $(2)^{1/2}$ times the set second distance.

6. The routing pattern of claim 2, further comprising redundant power vias disposed adjacent a border of the package substrate where an integrated circuit edge is designed to reside, where the redundant power vias connect in a straighter line between contacts on a first side of the package substrate, power planes, and contacts on an opposing second side of the package substrate than do other power vias.

7. The routing pattern of claim 2, further comprising power traces having a width that is greater than a width of the high speed signal traces.

8. A routing pattern for high speed signals for a package substrate, the routing pattern comprising traces for the high speed signals, where trace pairs for differential pairs of high speed signals have straight portions having a length between corners and other reflecting portions of the traces that is not an integer multiple of a minimum time between transitions of the high speed signal.

9. The routing pattern of claim 8, wherein the trace pairs for differential pairs of high speed signals,
   have substantially similar lengths,
   are bounded along substantially their entire lengths by grounded guard traces, and
   have arcing corners.

10. The routing pattern of claim 8, further comprising contacts for the high speed signals, the contacts connected to the high speed signal traces, where differential pairs of contacts associated with the differential pairs of high speed signals,
    are exclusively disposed adjacent an edge of the package substrate, with a first of the contacts in the differential pair of contacts disposed closer to the edge of the package substrate than a second of the contacts in the differential pair, are disposed such that a line through the differential pair of contacts is substantially perpendicular to the edge of the package substrate, the first contact in the differential pair of contacts is designated a positive contact and the second contact in the differential pair of contacts is designated a negative contact, and all of the differential pairs of contacts are consistently disposed with the positive contact and the negative contact in a consistent position in each differential pair of contacts relative to the edge of the package substrate, and are disposed at a set first distance one from another, and all contacts for the high speed signals are disposed from contacts for lower speed signals by a distance of more than $(2)^{1/2}$ times the set first distance.

11. The routing pattern of claim 8, further comprising vias for the high speed signals, the vias connected to the high speed signal traces, where differential pairs of vias associated with the differential pairs of high speed signals are disposed at a set second distance one from another, and all vias for the high speed signals are disposed from vias for lower speed signals by a distance of more than $(2)^{1/2}$ times the set second distance.

12. The routing pattern of claim 8, further comprising redundant power vias disposed adjacent a border of the package substrate where an integrated circuit edge is designed to reside, where the redundant power vias connect in a straighter line between contacts on a first side of the package substrate, power planes, and contacts on an opposing second side of the package substrate than do other power vias.

13. The routing pattern of claim 8, further comprising power traces having a width that is greater than a width of the high speed signal traces.

14. A routing pattern for high speed signals for a package substrate, the routing pattern comprising contacts for the high speed signals, where differential pairs of contacts associated with differential pairs of high speed signals, are exclusively disposed adjacent an edge of the package substrate, with a first of the contacts in the differential pair of contacts disposed closer to the edge of the package substrate than a second of the contacts in the differential pair, are disposed such that a line through the differential pair of contacts is substantially perpendicular to the edge of the package substrate, the first contact in the differential pair of contacts is designated a positive contact and the second contact in the differential pair of contacts is designated a negative contact, and all of the differential pairs of contacts are consistently disposed with the positive contact and the negative contact in a consistent position in each differential pair of contacts relative to the edge of the package substrate, and are disposed at a set first distance one from another, and all contacts for the high speed signals are disposed from contacts for lower speed signals by a distance of more than $(2)^{1/2}$ times the set first distance.

15. The routing pattern of claim 14, further comprising traces for the high speed signals, where trace pairs for differential pairs of high speed signals, have substantially similar lengths, are bounded along substantially their entire lengths by grounded guard traces, have arcing corners, and straight portions of the traces having a length between the arcing corners and other reflecting portions of the traces that is not an integer multiple of a minimum time between transitions of the high speed signals.

16. The routing pattern of claim 14, further comprising vias for the high speed signals, the vias connected to high speed signal traces, where differential pairs of vias associated with the differential pairs of high speed signals are disposed at a set second distance one from another, and all vias for the high speed signals are disposed from vias for lower speed signals by a distance of more than $(2)^{1/2}$ times the set second distance.

17. The routing pattern of claim 14, further comprising plane metal disposed symmetrically around the high speed contacts.

18. The routing pattern of claim 14, further comprising redundant power vias disposed adjacent a border of the package substrate where an integrated circuit edge is designed to reside, where the redundant power vias connect in a straighter line between contacts on a first side of the package substrate, power planes, and contacts on an opposing second side of the package substrate than do other power vias.

* * * * *